(12) United States Patent
Su et al.

(10) Patent No.: US 7,256,543 B2
(45) Date of Patent: Aug. 14, 2007

(54) ENCAPSULATION STRUCTURE OF ORGANIC ELECTROLUMINESCENCE DEVICE

(75) Inventors: Chih-Hung Su, Hsinchu (TW); Jiin-Jou Lih, Taichung (TW)

(73) Assignee: AU Optronics Corp., Hsin-Chu (TW)

( * ) Notice: Subject to any disclaimer, the term of this patent is extended or adjusted under 35 U.S.C. 154(b) by 164 days.

(21) Appl. No.: 11/201,209

(22) Filed: Aug. 11, 2005

(65) Prior Publication Data
US 2006/0170341 A1 Aug. 3, 2006

(30) Foreign Application Priority Data
Feb. 2, 2005 (TW) ............... 94103269 A

(51) Int. Cl.
*H01J 1/62* (2006.01)
(52) U.S. Cl. ...................... 313/512; 313/506
(58) Field of Classification Search ............... 313/498, 313/504, 506, 509, 512
See application file for complete search history.

(56) References Cited

U.S. PATENT DOCUMENTS

| 6,198,220 | B1 | 3/2001 | Jones et al. |
| 6,268,695 | B1 | 7/2001 | Affinito |
| 6,497,598 | B2 | 12/2002 | Affinito |
| 6,570,325 | B2 | 5/2003 | Graff et al. |
| 6,660,409 | B1 | 12/2003 | Komatsu et al. |
| 6,737,753 | B2 | 5/2004 | Kumar et al. |
| 6,765,351 | B2 | 7/2004 | Forrest et al. |
| 2002/0070663 | A1* | 6/2002 | Ogura et al. ............. 313/506 |

FOREIGN PATENT DOCUMENTS

| CN | 1568100 A | 1/2005 |
| JP | 07-169567 | 7/1995 |
| JP | 2000-294369 | 10/2000 |
| JP | 2004-103442 | 4/2004 |

* cited by examiner

*Primary Examiner*—Vip Patel
(74) *Attorney, Agent, or Firm*—Rabin & Berdo, PC

(57) ABSTRACT

An encapsulation structure of organic electroluminescence device (OELD) is provided. The encapsulation structure comprises a substrate, an OELD, a soft protection layer, a moisture absorption layer and a rigid protective layer. The OELD is disposed over the substrate. The soft protection layer is disposed over the substrate, and encloses the OELD. The moisture absorption layer encloses the soft protection layer. The rigid protective layer encloses the moisture absorption layer.

16 Claims, 4 Drawing Sheets

ENCAPSULATION STRUCTURE OF ORGANIC ELECTROLUMINESCENCE DEVICE

This application claims the benefit of Taiwan application Ser. No. 094103269, filed Feb. 2, 2005, the subject matter of which is incorporated herein by reference.

BACKGROUND OF THE INVENTION

1. Field of the Invention

The invention relates in general to an encapsulation structure of organic electroluminescence device (OELD) and, more particularly, to the encapsulation structure of OELD being resistant to moisture and stress releasable.

2. Description of the Related Art

Use of organic electroluminescence device (OELD) in the flat panel displays possesses several competitive advantages, such as self illumination, high brightness, wide viewing angle, vivid contrast, quick response, broad range of operating temperature, high luminous efficiency and uncomplicated process of fabrication. Thus, the OELD represents a promising technology for display applications and has receives the worldwide attention in the recent years.

The typical structure of OELD is mainly constructed by interposing an organic light emitting layer between an anode and a cathode. A hole injection layer (HIL) and a hole transport layer (HTL) are interposed between the anode and the organic light emitting layer. An electron transport layer (ETL) is interposed between the cathode and the organic light emitting layer. This laminated structure of OELD facilitates the electron flow from the cathode to the anode. The organic light emitting layer can be divided into tow groups according to the materials in use. One group is a molecule-based light emitting diode, substantially comprising the dyestuffs or pigments, and so called as "OLED" (i.e. organic light emitting diode) or "OEL" (i.e. organic electroluminescence). The other group is a polymer-based light emitting diode, so called as "PLED" (i.e. polymer light emitting diode) or "LEP" (i.e. light emitting polymer). Whether the OLED or the PLED is applied in the organic electroluminescence device, the moisture shock has the considerable effect on the image quality displayed by the device. Those common effects includes the short emitting life, low emitting efficiency of the organic light emitting layer caused by the material degradation, and the "dark spot" (i.e. the spot of the light emitting portion unable to emit the light which results from a lack of current flow at the spot) caused by the adhesion failure between the organic light emitting layer and the cathode. Therefore, it is necessary to protect the organic electroluminescence device from the moisture intrusion.

FIG. 1 illustrates a conventional structure for protecting the organic electroluminescence device. A lamination structure 6, formed on a substrate 2, comprises an anode 3 (made of indium tin oxide (ITO), indium zinc oxide (IZO) or cadmium tin oxide (CTO)), an organic light emitting layer 4 and a cathode 5. Also, a transparent casing such as a glass sealing case 7 is assembled with the substrate 2, thereby providing an internal space 10 between the glass sealing case 7 and the lamination structure 6. The solid desiccating agent 8 and dried inert gas are enclosed in the internal space 10. The solid desiccating agent 8 absorbs moisture and maintains the solid state even after absorbing the moisture. The dried inert gas is used for isolating the solid desiccating agent 8 from the lamination structure 6. Although this conventional structure of FIG. 1 does ease the moisture shock to the organic electroluminescence device, it is too bulky to be practical for the future displayer design (i.e. can not meet the thin, light and portable requirements of the future product). Also, the stress generated during the fabricating process and accumulated in the conventional structure of FIG. 1 cannot be released due to the rigid components for composing the structure.

FIG. 2 illustrates the other conventional structure for protecting the organic electroluminescence device. The electroluminescence unit U includes an anode 11, a hole transport layer (HTL) 12, a light emitting layer 14, a electron transport layer 16 and a cathode 18. The electroluminescence unit U is covered with a protective structure comprising an organic barrier layer 20 and an inorganic barrier layer 22. The electroluminescence unit U and the protective structure are preferably supported by a substrate 24. Both of the organic barrier layer 20 and the inorganic barrier layer 22 are made of the materials being resistant to moisture to an extent (such as a cured resin), so as to form a double-layer structure for protecting the electroluminescence unit U. However, the organic barrier layer 20 is still moisture permeable. The moisture could invade the electroluminescence unit U through the exposed edges of the organic barrier layer 20, or through the interface between the organic barrier layer 20 and the substrate 24. Moreover, because the stress generated during the fabricating process and accumulated in the structure of FIG. 2 cannot be well released, it is impossible to form a pinhole-free and micro crack-free inorganic barrier layer 22. Even the double-layer protection (including the organic barrier layer and the defective inorganic barrier layer 22 with the pinholes and micro cracks) is applied in the structure of FIG. 2, the moisture still penetrates and cause damage to the electroluminescence unit U.

Another conventional structure, found in U.S. Pat. No. 6,268,695 by Affinito, disclosed a flexible environmental barrier used on both sides of an organic electroluminescence device. The flexible environmental barrier may be a foundation, a cover, or a combination thereof (which is preferred). Either or both of the foundation and/or the cover may have multiple layers (e.g. several organic and inorganic barrier layer laminated one by one), for ensuring the moisture-proof of the flexible environmental barrier. However, long fabrication time and large amount of raw materials are needed for making the multiple barrier layers. Therefore, fabrication of the structure provided by Affinito is time-consuming and high production cost.

SUMMARY OF THE INVENTION

It is therefore an object of the present invention to provide an encapsulation structure of organic electroluminescence device (OELD), for effectively preventing the OELD from the moisture shock and for being a stress-releasable encapsulation structure.

The present invention achieves the objects by providing an encapsulation structure of organic electroluminescence device comprises a substrate, an organic electroluminescence device (OELD), a soft protection layer, a moisture absorption layer and a rigid protective layer. The OELD is disposed on the substrate, and the soft protection layer is disposed on the substrate and encloses the OELD. The moisture absorption layer is disposed on the substrate and encloses the soft protection layer. The rigid protective layer is disposed on the substrate and encloses the moisture absorption layer.

Other objects, features, and advantages of the present invention will become apparent from the following detailed description of the preferred but non-limiting embodiment. The following description is made with reference to the accompanying drawings.

DETAILED DESCRIPTION OF THE INVENTION

In the present invention, an encapsulation structure of organic electroluminescence device (OELD) is disclosed, for effectively preventing the OELD from the moisture shock and for being a stress-releasable encapsulation structure. A preferred embodiment disclosed herein is used for illustrating the present invention, but not for limiting the scope of the present invention. Additionally, the drawings used for illustrating the embodiments of the present invention only show the major characteristic parts in order to avoid obscuring the present invention. Accordingly, the specification and the drawings are to be regard as an illustrative sense rather than a restrictive sense.

Moreover, the organic light emitting layer of the organic electroluminescence device can be divided into tow groups according to the materials in use. One group is a molecule-based light emitting diode, substantially comprising the dyestuffs or pigments, and so called as "OLED" (i.e. organic light emitting diode) or "OEL" (i.e. organic electroluminescence). The other group is a polymer-based light emitting diode, so called as "PLED" (i.e. polymer light emitting diode) or "LEP" (i.e. light emitting polymer). The encapsulation structure of the embodiment could be applicable to encapsulate the "OLED" or "PLED".

Figure 1:
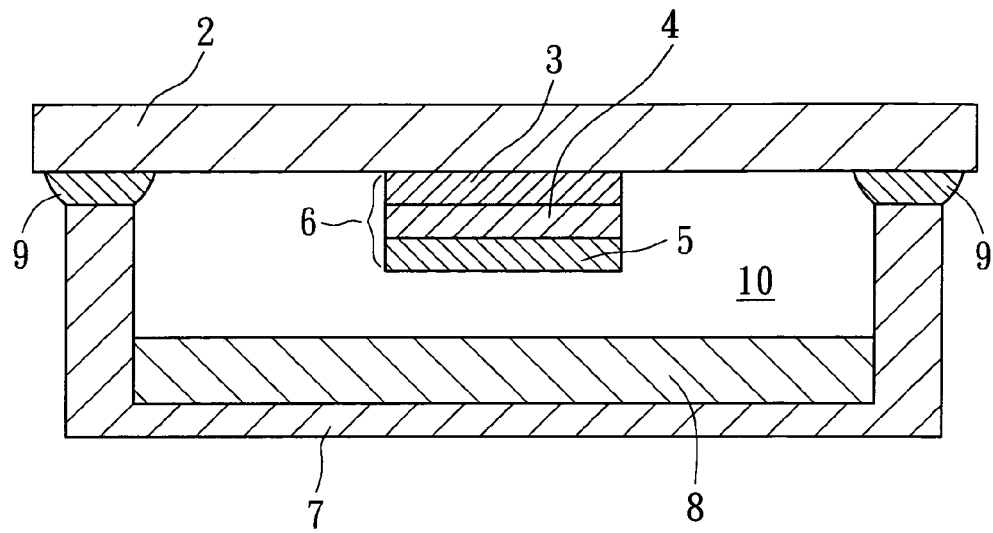
FIG. 1 (related art) illustrates a conventional structure for protecting the organic electroluminescence device.
Figure 2:
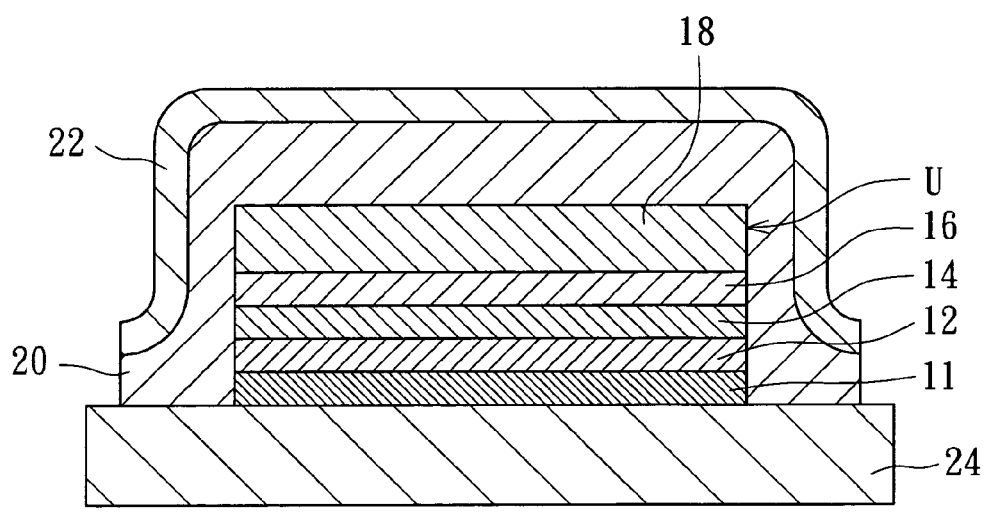
FIG. 2 (related art) illustrates the other conventional structure for protecting the organic electroluminescence device.
Figure 3:
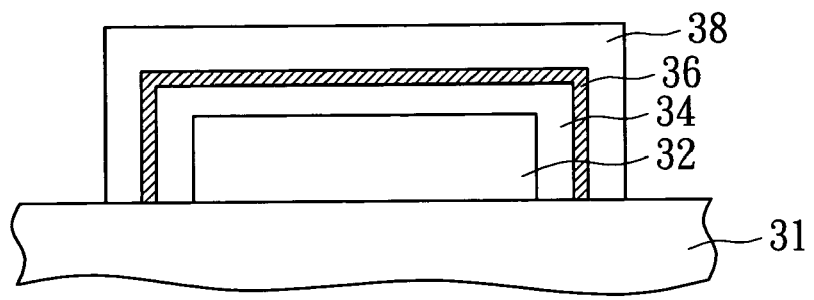
FIG. 3 illustrates an encapsulation structure of organic electroluminescence device according to the embodiment of the present invention.

FIG. 3 illustrates an encapsulation structure of organic electroluminescence device according to the embodiment of the present invention. The organic electroluminescence device (OELD) 32 is disposed on a substrate 31. A sandwich-like structure, comprising a soft protection layer 34, a moisture absorption layer 36 and a rigid protective layer 38, is further formed over the OELD 32, for the purpose of protection and encapsulation. The soft protection layer 34 is disposed on the substrate 31 and encloses the OELD 32. The moisture absorption layer 36 is disposed on the substrate 31 and encloses the soft protection layer 34. The rigid protective layer 38 is disposed on the substrate 31 and encloses the moisture absorption layer 36. According to the present embodiment, the thickness of the soft protection layer 34 ranges from about 50 nm to about 1000 nm. The thickness of the moisture absorption layer 36 ranges from about 50 nm to about 2000 nm. The thickness of the rigid protective layer 38 ranges from about 50 nm to about 1000 nm.

According to the present embodiment, the moisture absorption layer 36 is sandwiched between the soft protection layer 34 and the rigid protective layer 38. The rigid protective layer 38 functions as the first barrier to reduce the permeation of ambient moisture, and protects the moisture absorption layer 36, the soft protection layer 34 and the OELD 32 from the physical shocks such as collision or scratch. The small amount of moisture permeating the rigid protective layer 38 is absorbed by the moisture absorption layer 36. The soft protection layer 34 interposed between the moisture absorption layer 36 and the OELD 32 can be a preventive barrier for resisting the moisture, and prevents the damp moisture absorption layer 36 from directly contacting the OELD 32. Also, the soft protection layer 34 functions as the buffer to lessen or absorb the shock of an impact, thereby protecting the OELD 32 against the collision. Moreover, the stress generated during the fabricating process and accumulated in the structure of FIG. 3 can be effectively released due to the sandwiched encapsulation structure of organic electroluminescence device.

The rigid protective layer 38 could include an inorganic material, a low active metal, or a low active metal alloy. Examples of the inorganic material include silicon oxide (SiO), silicon nitride (SiN), silicon oxynitride (SiON), silicon carbide (SiC), aluminum oxide (AlO) and the combination thereof. Examples of the low active metal include platinum (Pt), silver (Ag), gold (Au), and an alloy thereof.

The moisture absorption layer 36 could include an active metal or a metal alloy, such as calcium (Ca), strontium (Sr), barium (Ba), or the alloy thereof. Also, the moisture absorption layer 36 could include a metal oxide or a metal sulfide, such as calcium oxide (CaO), strontium oxide (SrO), barium oxide (BaO), barium sulfide (BaS), strontium sulfide (SrS), calcium sulfide (CaS) or the combination thereof. The soft protection layer 34 could be made of the flexible material with moisture-absorbing property, such as silicon nitride or the polymer that meets the requirement.

Figure 4A:
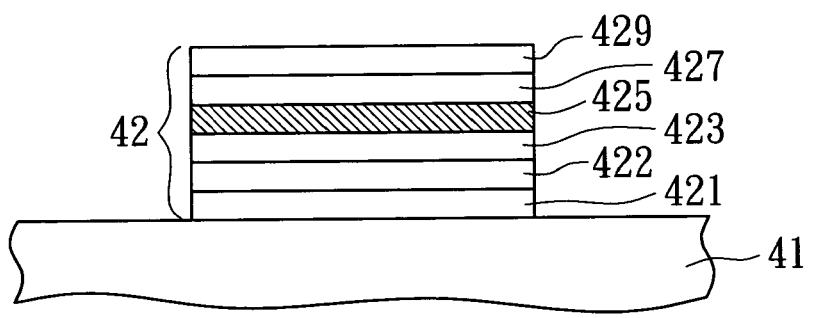
FIG. 4A~FIG. 4D illustrate a process for fabricating the encapsulation structure of organic electroluminescence device according to the embodiment of the present invention.

FIG. 4A~FIG. 4D illustrate a process for fabricating the encapsulation structure of organic electroluminescence device according to the embodiment of the present invention. First, a substrate 41 such as a transparent glass is provided, and an organic electroluminescence device (OELD) 42 is formed on the substrate 41, as shown in FIG. 4A. The organic light emitting layer of the organic electroluminescence device can be the "OLED" (organic light emitting diode) or "PLED" (polymer light emitting diode).

In this embodiment, the organic electroluminescence device (OELD) 42 comprises an anode 421, a hole injection layer (HIL) 422, a hole transport layer (HTL) 423, an organic light emitting layer 425, an electron transport layer (ETL) 427 and a cathode 429, laminated in an order.

Figure 4B:
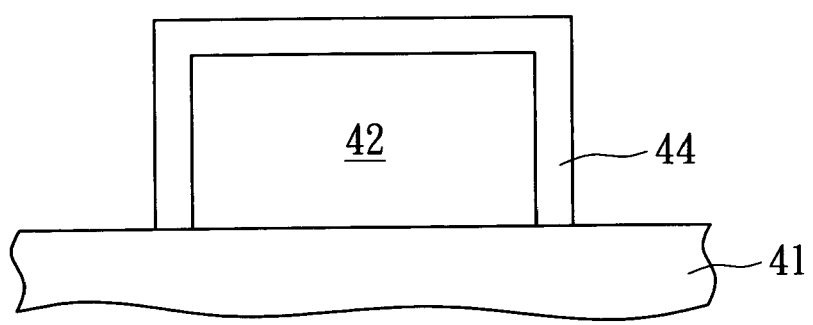

Next, a soft protection layer 44 is disposed on the substrate 41 and encloses the OELD 42, as shown in FIG. 4B. Preferably, the thickness of the soft protection layer 34 ranges from about 50 nm to about 1000 nm. In a practical fabrication, a silicon nitride layer formed by sputtering or chemical vapor deposition can serve as the soft protection layer 44.

Figure 4C:
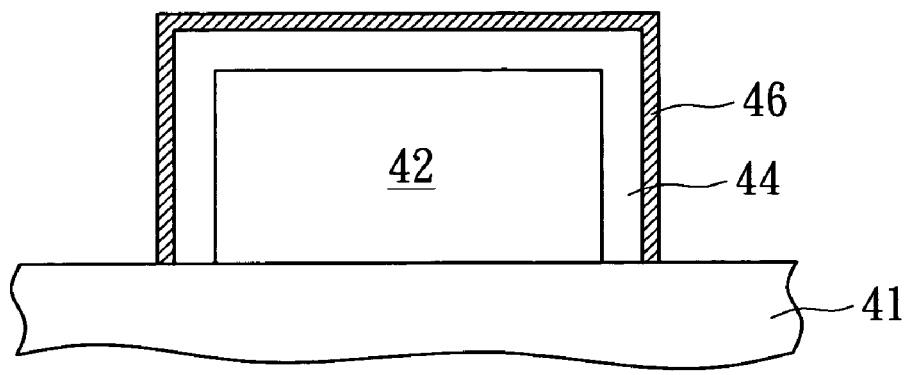

Then, a moisture absorption layer 46 is formed on the substrate 41 and encloses the soft protection layer 44, as shown in FIG. 4C. Preferably, the thickness of the moisture absorption layer 46 ranges from about 50 nm to about 2000 nm. In a practical fabrication, a calcium oxide layer is formed by sputtering or thermal evaporation to be the moisture absorption layer 46.

Figure 4D:
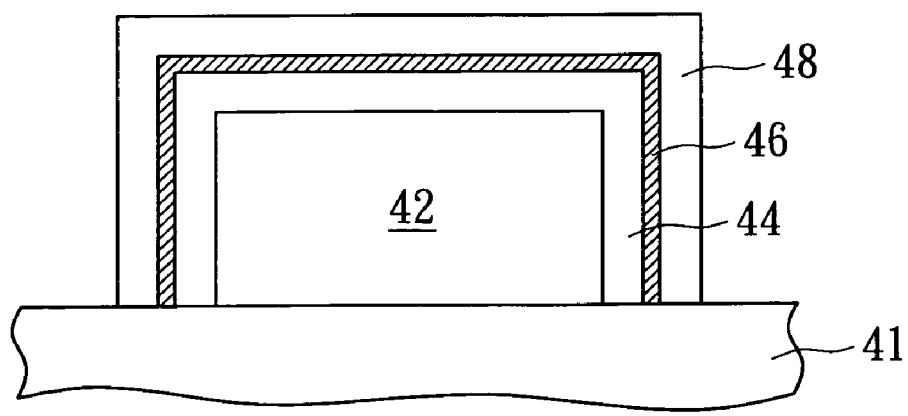

Afterward, a rigid protective layer 48 is formed on the substrate 41 and encloses the moisture absorption layer 46, as shown in FIG. 4D. Preferably, the thickness of the rigid protective layer 48 ranges from about 50 nm to about 1000 nm. In a practical fabrication, an inorganic layer (such as a silicon nitride layer) is formed by sputtering or chemical vapor deposition for being the rigid protective layer 48.

Figure 5A:
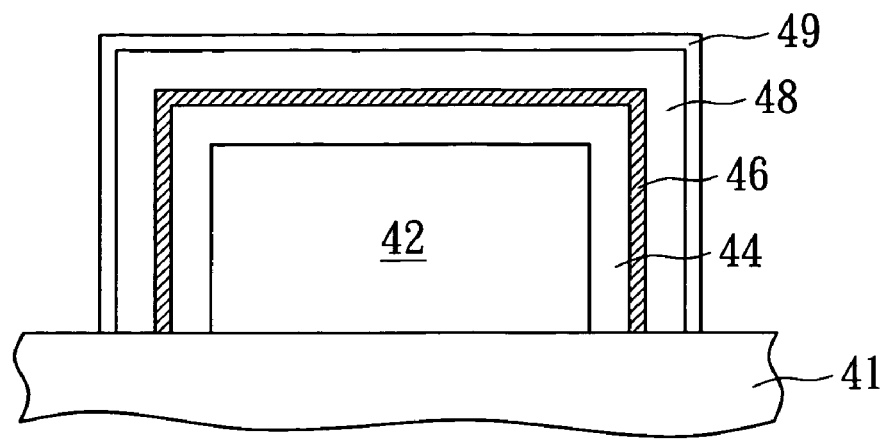
FIG. 5A and FIG. 5B respectively illustrates the encapsulation structures of organic electroluminescence device according to the first and second applications of the present invention.
Figure 5B:
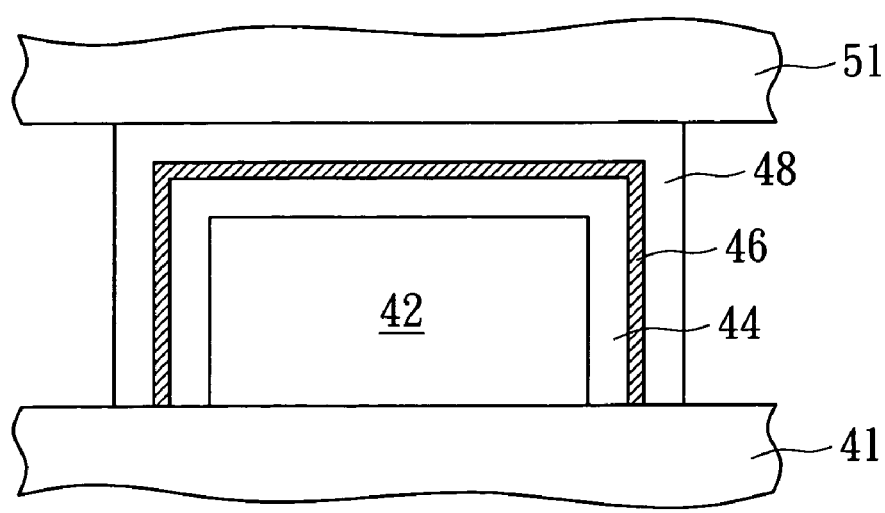

Also, the other barrier layers can be optionally added to the encapsulation structure of OELD in the practical application, for providing a full protection. FIG. 5A and FIG. 5B respectively illustrates the encapsulation structures of organic electroluminescence device according to the first and second applications of the present invention.

In FIG. 5A, the soft protection layer 44, disposed on the substrate 41, encloses the OELD 42. The moisture absorption layer 46, disposed on the substrate 41, encloses the soft protection layer 44. The rigid protective layer 48, disposed on the substrate 41, encloses the moisture absorption layer 46. Furthermore, a hard coat layer 49, is formed on the substrate 41, encloses the rigid protective layer 48, to provide a more protective encapsulation structure of OELD 42.

Besides the hard coat layer 49 as depicted in FIG. 5A, another substrate (such as a transparent glass) 51 can be attached to the rigid protective layer 48 as shown in FIG. 5B, to fully protect the encapsulation structure.

It is, of course, understood that the encapsulation structure of the embodiment of the present invention can be used for protecting a top emission OELD or a bottom emission OELD. Also, the encapsulation structure of the embodiment of the present invention can be applied to a passive matrix organic electroluminescence display (PMOELD), or an active matrix organic electroluminescence display (AMOELD).

According to the aforementioned description, the encapsulation structure of organic electroluminescence device (OELD) of the embodiment of the present invention not only prevents the OELD from the moisture shock effectively, but also buffers the physical impact to the OELD. The stress of the encapsulation structure can also be released. Moreover, the sandwiched encapsulation structure simplifies the process to make it easier to fabricate, thereby reducing the fabrication time. The sandwiched encapsulation structure also reduces the occurrence of the defects (such as pinholes, hillock and micro cracks), so as to increase the production yield and decrease the production cost.

While the present invention has been described by way of example and in terms of the preferred embodiment, it is to be understood that the present invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An encapsulation structure of an organic electroluminescence device, comprising:
   a substrate;
   an organic electroluminescence device (OELD) disposed on the substrate;
   a soft protection layer, disposed on the substrate, for enclosing the OELD;
   a moisture absorption layer, disposed on the substrate, for enclosing the soft protection layer; and
   a rigid protective layer, disposed on the substrate, for enclosing the moisture absorption layer.

2. The encapsulation structure according to claim 1, wherein the soft protection layer comprises a silicon nitride layer.

3. The encapsulation structure according to claim 1, wherein the soft protection layer comprises a polymer layer.

4. The encapsulation structure according to claim 1, wherein the moisture absorption layer comprises an active metal or an active metal alloy.

5. The encapsulation structure according to claim 4, wherein the active metal comprises calcium (Ca), strontium (Sr), barium (Ba), or an alloy thereof.

6. The encapsulation structure according to claim 1, wherein the moisture absorption layer comprises a metal oxide or a metal sulfide.

7. The encapsulation structure according to claim 6, wherein the moisture absorption layer comprises calcium oxide (CaO), strontium oxide (SrO), barium oxide (BaO), barium sulfide (BaS), strontium sulfide (SrS), calcium sulfide (CaS), or a combination thereof.

8. The encapsulation structure according to claim 1, wherein the rigid protective layer is substantially made of an inorganic material.

9. The encapsulation structure according to claim 8, wherein the inorganic material comprises silicon oxide (SiO), silicon nitride (SiN), silicon oxynitride (SiON), silicon carbide (SiC), aluminum oxide (AlO), or a combination thereof.

10. The encapsulation structure according to claim 1, wherein the rigid protective layer comprises a low active metal or a low active metal alloy.

11. The encapsulation structure according to claim 10, wherein the low active metal comprises platinum (Pt), silver (Ag), gold (Au), or an alloy thereof.

12. The encapsulation structure according to claim 1, further comprising:
    a hard coat layer disposed on the rigid protective layer substantially made of a polymer.

13. The encapsulation structure according to claim 1, further comprising:
    another substrate attached on the rigid protective layer.

14. The encapsulation structure according to claim 1, wherein the thickness of the soft protection layer ranges from about 50 nm to about 1000 nm.

15. The encapsulation structure according to claim 1, wherein the thickness of the moisture absorption layer ranges from about 50 nm to about 2000 nm.

16. The encapsulation structure according to claim 1, wherein the thickness of the rigid protective layer ranges from about 50 nm to about 1000 nm.

* * * * *